(12) United States Patent
Kang et al.

(10) Patent No.: US 10,964,717 B2
(45) Date of Patent: Mar. 30, 2021

(54) METHODS AND APPARATUS FOR THREE-DIMENSIONAL NAND STRUCTURE FABRICATION

(71) Applicant: APPLIED MATERIALS, INC., Santa Clara, CA (US)

(72) Inventors: Sung-Kwan Kang, San Jose, CA (US); Gill Lee, San Jose, CA (US); Chang Seok Kang, San Jose, CA (US); Tomohiko Kitajima, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/528,800

(22) Filed: Aug. 1, 2019

(65) Prior Publication Data

US 2020/0235122 A1    Jul. 23, 2020

Related U.S. Application Data

(60) Provisional application No. 62/794,819, filed on Jan. 21, 2019.

(51) Int. Cl.
*H01L 27/11582* (2017.01)
*H01L 21/67* (2006.01)
(Continued)

(52) U.S. Cl.
CPC .. *H01L 27/11582* (2013.01); *H01L 21/67207* (2013.01); *H01L 21/7682* (2013.01); *H01L 21/31122* (2013.01)

(58) Field of Classification Search
CPC ................ H01L 21/7682; H01L 27/11582
See application file for complete search history.

(56) References Cited

U.S. PATENT DOCUMENTS

| 5,236,550 A | 8/1993 | Abt et al. |
| 8,658,499 B2 | 2/2014 | Makala et al. |
| (Continued) | | |

OTHER PUBLICATIONS

W. Holber, X. Chen, D. Smith and M. Besen, "Use of a remote plasma source for CVD chamber clean and exhaust gas abatement applications," IEEE Conference Record—Abstracts. 1999 IEEE International Conference on Plasma Science. 26th IEEE International Conference (Year: 1999).*

*Primary Examiner* — Robert G Bachner
*Assistant Examiner* — Molly K Reida
(74) *Attorney, Agent, or Firm* — Moser Taboada

(57) ABSTRACT

Methods and apparatus for forming a plurality of nonvolatile memory cells are provided herein. In some embodiments, the method, for example, includes forming, on a substrate, a stack of alternating layers including a first layer of material and a second layer of material different from the first layer of material; forming a memory hole in the stack of alternating layers of the first layer of material and the second layer of material; depositing a layer of blocking oxide on sides defining the memory hole; depositing a layer of silicon atop the layer of blocking oxide to form a silicon channel; deposit core oxide to fill the silicon channel; removing the first layer of material to form spaces between the alternating layers of the second material; and one of depositing a third layer of material to partially fill the spaces to leave air gaps therein or depositing a fourth layer of material to fill the spaces.

20 Claims, 4 Drawing Sheets

(51) Int. Cl.
*H01L 21/768* (2006.01)
*H01L 21/311* (2006.01)

(56) References Cited

U.S. PATENT DOCUMENTS

| | | | |
|---|---|---|---|
| 9,230,983 | B1 | 1/2016 | Sharangpani et al. |
| 9,653,311 | B1 | 5/2017 | Ahn et al. |
| 9,875,929 | B1 * | 1/2018 | Shukla .............. H01L 27/11582 |
| 2010/0155801 | A1 | 6/2010 | Doyle et al. |
| 2010/0198687 | A1 | 8/2010 | Bang et al. |
| 2014/0220750 | A1 * | 8/2014 | Sohn ................... H01L 29/7926 |
| | | | 438/269 |
| 2015/0194441 | A1 * | 7/2015 | Yatsuda .............. H01L 27/1157 |
| | | | 438/587 |
| 2015/0357342 | A1 | 12/2015 | Lee |

* cited by examiner

US 10,964,717 B2

METHODS AND APPARATUS FOR THREE-DIMENSIONAL NAND STRUCTURE FABRICATION

CROSS-REFERENCE TO RELATED APPLICATIONS

The present application claims the benefit of and priority to U.S. Provisional Application Ser. No. 62/794,819, which was filed on Jan. 21, 2019, the entire contents of which is incorporated herein by reference.

FIELD

Embodiments of the present disclosure generally relate to substrate processing equipment, and more particularly, to methods and apparatus for three-dimensional (3D) NAND structure fabrication.

BACKGROUND

To address challenges encountered in scaling planar (2D) NAND memory devices to achieve higher densities at a lower cost per bit, ultra-high density, three-dimensional (3D) stacked memory structures have been introduced. Such 3D memory structures are sometimes referred to as having a Bit Cost Scalable (BiCS) architecture, and include strings of vertically aligned memory cells. Typically, the vertically aligned memory cells are formed from an array of alternating conductor and insulator layers, where the conductive layers correspond to the word lines of the memory structure.

As the number of vertically stacked memory cells in 3D NAND devices increases (e.g., as chip densities increase), the aspect ratio of memory cell strings also increases, introducing numerous manufacturing issues. The inventor has observed for example, as stacking increases, the difficulty in etching/filling and stress control also increases. The inventor has further observed that thinning down the layers in the stack in an effort to maintain the aspect ratio of the memory cell strings within manageable limits results in more challenging downstream etch processes.

Accordingly, the inventor has provided methods and apparatus for 3D NAND structure fabrication.

SUMMARY

Methods and apparatus for forming a plurality of nonvolatile memory cells are provided herein. In some embodiments, the method includes forming, on a substrate, a stack of alternating layers including a first layer of material and a second layer of material different from the first layer of material; forming a memory hole in the stack of alternating layers of the first layer of material and the second layer of material; depositing a layer of blocking oxide on sides defining the memory hole; depositing a layer of silicon atop the layer of blocking oxide to form a silicon channel; depositing core oxide to fill the silicon channel; removing the first layer of material to form spaces between the alternating layers of the second layer of material; and one of depositing a third layer of material to partially fill the spaces to leave air gaps therein or depositing a fourth layer of material to fill the spaces.

In accordance with an aspect of the present disclosure, there is provided a method for forming a plurality of nonvolatile memory cells. The method includes forming, on a substrate, a stack of alternating layers including a first layer of material and a second layer of material different from the first layer of material; forming a memory hole in the stack of alternating layers of the first layer of material and the second layer of material; depositing a layer of blocking oxide on sides defining the memory hole; depositing a layer of silicon atop the layer of blocking oxide to form a silicon channel; depositing core oxide to fill the silicon channel; removing the first layer of material to form spaces between the alternating layers of the second layer of material; and one of depositing a third layer of material to partially fill the spaces to leave air gaps therein or depositing a fourth layer of material to fill the spaces, wherein the first layer of material is carbon, the second layer of material is ruthenium, the third layer of material is oxide, and the fourth layer of material is a low k oxide.

In accordance with an aspect of the present disclosure, there is provided a system for forming a plurality of nonvolatile memory cells. The system includes an apparatus configured to form, on a substrate, a stack of alternating layers including a first layer of material and a second layer of material different from the first layer of material; an apparatus configured to form a memory hole in the stack of alternating layers of the first layer of material and the second layer of material; an apparatus configured to deposit a layer of blocking oxide on sides defining the memory hole, deposit a layer of silicon atop the layer of blocking oxide to form a silicon channel, and deposit core oxide to fill the silicon channel; an apparatus configured to remove the first layer of material to form spaces between the alternating layers of the second layer of material; and an apparatus configured to one of deposit a third layer of material to partially fill the spaces to leave air gaps therein or deposit a fourth layer of material to fill the spaces.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
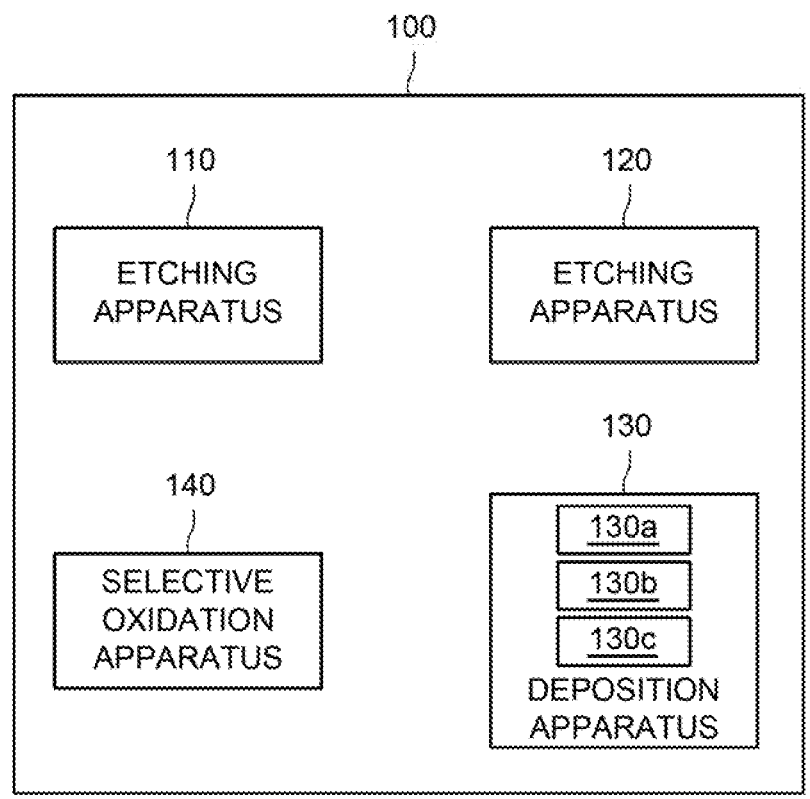
FIG. 1 is a schematic diagram of a system for forming a plurality of nonvolatile memory cells in a 3D NAND memory device, in accordance with at least one embodiment of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments described herein generally relate to 3D NAND memory devices with improved word-line isolation and methods of forming the same. Specifically, alternative metal/insulator multi-layers are used for 3D NAND cell film stack to form memory holes, and the insulator layers are subsequently removed forming spaces that are then filled with one or more materials, e.g., a low k oxide or an air gap.

Figure 2:
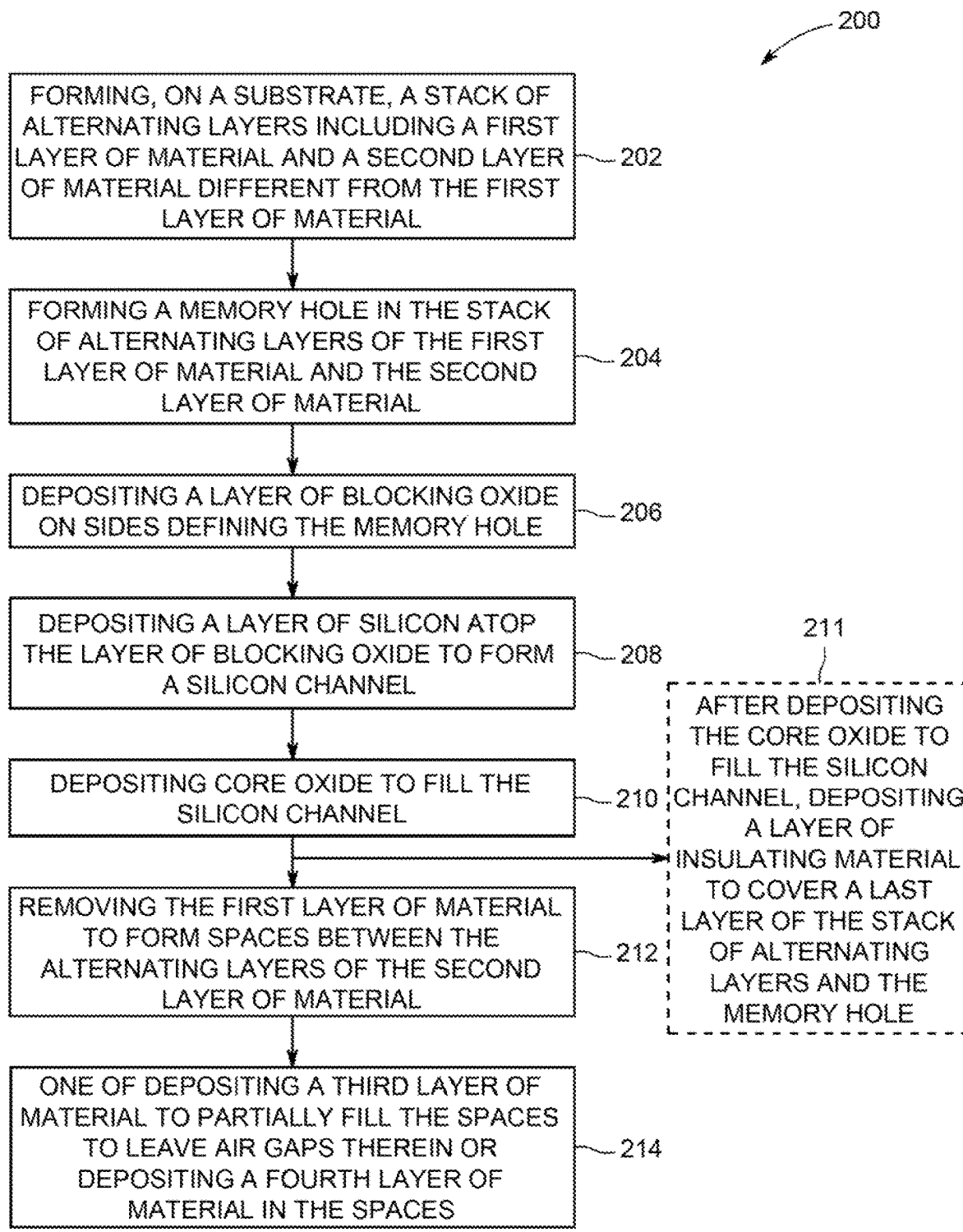
FIG. 2 is a flowchart of a method for forming a plurality of nonvolatile memory cells in a 3D NAND memory device, in accordance with at least one embodiment of the present disclosure.

FIG. 1 is a schematic diagram of a system 100 for forming a plurality of nonvolatile memory cells in a 3D NAND memory device (e.g., memory device 300 of FIGS. 3A-3F). FIG. 2 is a flowchart of a method 200 for forming the plurality of nonvolatile memory cells in the memory device, according to an embodiment of the present disclosure. FIGS. 3A-3F are schematic cross-sectional views of a portion of a 3D NAND memory device during stages of fabrication in accordance with at least one embodiment of the present disclosure, for example, using the method 200.

Figure 3A:
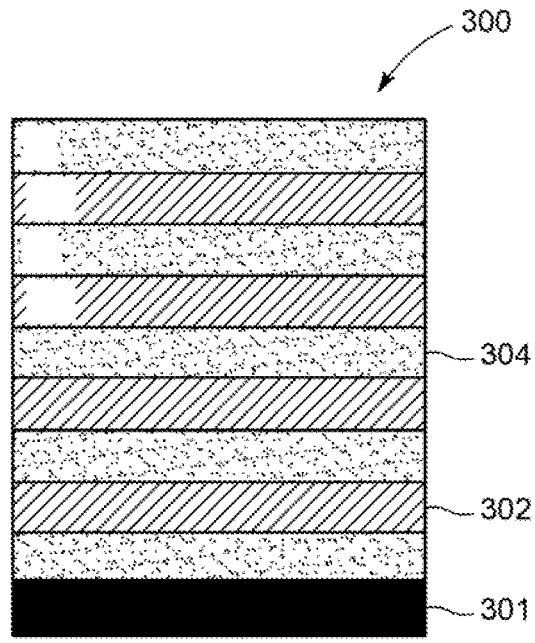
FIGS. 3A-3F are schematic cross-sectional views of a portion of a 3D NAND memory device, in accordance with at least one embodiment of the present disclosure.

FIG. 3A shows the memory device 300, which can be a Bit Cost Scalable (BiCS) device, including a string (plurality) of vertically stacked memory cell layers 302 (memory cell layers 302). The memory cell layers 302 can be, for example, a conductive layer used as word line (e.g., a first layer of material) alternately disposed between a plurality of layers 304 (e.g., a second layer of material), formed on a substrate 301 (substrate 301), which in some embodiments can be a semiconductor.

The substrate 301 can be any suitable starting material for forming integrated circuits, such as a silicon (Si) wafer or a germanium (Ge) wafer. The substrate 301 may be a silicon semiconductor substrate having a layer or layers formed thereon, such as a film stack, employed to form a structure on substrate 301, such as the memory device 300. The substrate 301 may include a material such as crystalline silicon (e.g., Si<100> or Si<111>), silicon oxide, strained silicon, silicon germanium, doped or undoped polysilicon, doped or undoped silicon, patterned or non-patterned wafer, silicon on insulator (SOI), carbon-doped silicon oxides, silicon nitride, doped silicon, germanium, gallium arsenide, glass, sapphire, metal layers disposed on silicon, and the like. The substrate 301 may be a round wafer, such as a 200 mm, 300 mm, or 450 mm diameter wafer, or as a rectangular or square panel.

In some embodiments, the memory cell layers 302 and layers 304 can be formed on an etch stop layer (ESL) or common source (not shown). In such embodiments, the ESL and/or common source can be made from materials such as tungsten, polysilicon, or combinations thereof.

Layers 304 are disposed between memory cell layers 302. The layers 304 may be formed using any suitable material, such as carbon, silicon carbide, silicon oxycarbide, etc. The layers 304 are provided to facilitate forming (or building) the memory cell layers 302 on the substrate 301. After the memory cell layers 302 are formed, the layers 304 are removed using one or more suitable processes and filled with one or more suitable materials, as will be described in greater detail below.

Each of the memory cell layers 302 corresponds to a word line of the memory device 300, each word line extending into the page to form additional memory cells of the memory device 300 that are not visible. Thus, each of the memory cell layers 302 is configured to store one or more bits of data. As such, each of the memory cell layers 302 can be formed using any suitable material, such as tungsten (W), tungsten silicide (WSi), tungsten polysilicon (poly Si) (W/poly), tungsten alloy, tantalum (Ta), titanium (Ti), copper (Cu), ruthenium (Ru), nickel (Ni), cobalt (Co), chromium (Cr), iron (Fe), manganese (Mn), aluminum (Al), hafnium (Hf), vanadium (V), molybdenum (Mo), palladium (Pd), gold (Au), silver (Au), platinum (Pt), alloys thereof, nitride compounds thereof, such as titanium nitride (TiN) and tantalum nitride (TaN), and combinations thereof, among others. For example, the inventors have found that the use of ruthenium can improve the electrical performance, such as electrical conductivity, and mobility, and the like, in the memory cell layers 302, i.e., when later utilized as a gate structure in the memory device 300.

Continuing with reference to FIG. 3A, at 202, the memory cell layers 302 and layers 304 can be deposited on the substrate 301 using any suitable deposition processes and/or apparatus 130 (FIG. 1), examples of which can include a chemical vapor deposition apparatus (CVD) 130a, a physical vapor deposition apparatus (PVD) 130b, or an atomic layer deposition apparatus (ALD) 130c. For example, in one particular embodiment, the layers 304 (e.g., formed using carbon) can be deposited using for example, the CVD apparatus 130a, which can be a stand-alone apparatus or a cluster tool, that is configured, for example, to perform a CVD process. One such apparatus can be, for example, the PRODUCER® APF line of stand-alone CVD apparatus, available from Applied Materials, Inc. Similarly, the memory cell layers 302 (e.g., formed using ruthenium) can be deposited using for example, the PVD apparatus 130b, which can be a stand-alone apparatus or a cluster tool, that is configured, for example, to perform a PVD process. One such apparatus can be, for example, the ENDURA® VERSA® line of stand-alone PVD apparatus, available from Applied Materials, Inc.

Figure 3B:
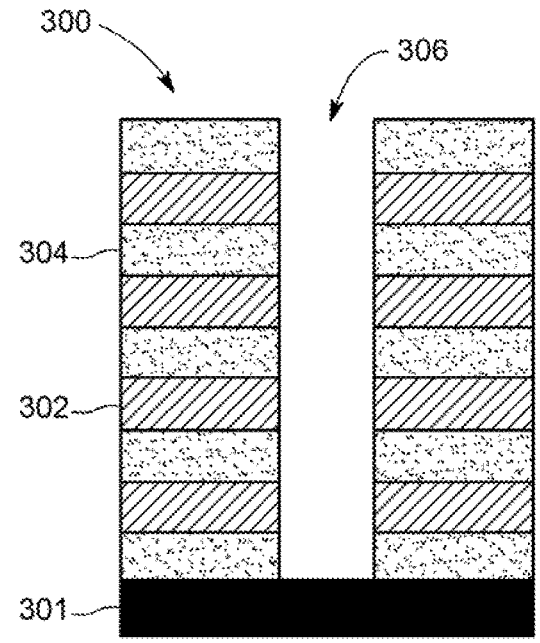

With reference to FIG. 3B, at 204 a memory hole 306 (or memory holes 306) is formed in the stack of alternating memory cell layers 302 and layers 304 deposited on the substrate 301. The string of vertically stacked memory cell layers 302 and layers 304 are shown arranged with two vertical columns. Any suitable etching apparatus 110 (FIG. 1) and/or method may be employed to form the memory hole 306, such as deep reactive-ion etching (DRIE), a highly anisotropic etch process employed to create high aspect-ratio holes and trenches in wafers or other substrates. Etching gases suitable for such etching processes can include, but are not limited to, an oxygen containing gas (e.g., $O_3$, $O_2$, $CO_2$, CO, $H_2O$, NO, $NO_2$, $N_2O$, CO, and the like) and optionally may include an inert gas, such as argon (Ar) or helium (He). A hard mask deposition process may first be performed prior to performing the etching at 204, and a hard mask layer that is deposited prior to etching at 204 can be removed after etching is complete and the memory hole 306 is formed. Other etching apparatus and/or processes can be used to form the memory holes 306.

Figure 3C:
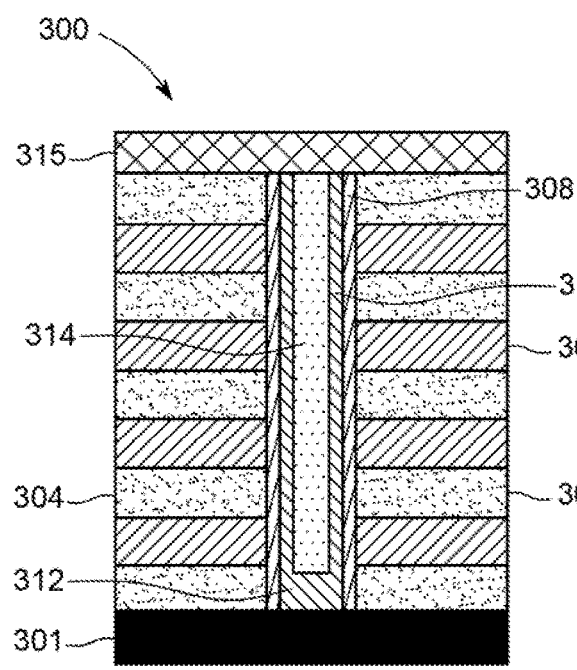

With reference to FIG. 3C, after the memory hole 306 is formed at 204, at 206 a layer of blocking oxide 308 can be deposited. The blocking oxide can include one or more films or layers. For example, the blocking oxide can include gate oxide, charge storage film, and/or tunnel oxide and can include one or more of the following materials poly Si, $SiO_2$, SiOC, $Si_3N_4$, $Al_2O_3$, $Y_2O_3$, $ZrO_2$, and/or $HfO_2$. In some embodiments, the blocking oxide 308 is deposited on sides that define the formed memory hole 306, without (or with minimal of) the blocking oxide 308 being deposited atop the substrate 301. Next, at 208 a layer of silicon 310 is deposited atop the layer of blocking oxide 308 and atop the substrate 301 along the bottom of the memory hole 306 to form a silicon channel 312 at the bottom of the memory hole 306. Next, at 210 core oxide 314 (e.g., SiO, SiOC, etc.) is deposited to fill the silicon channel 312. The layer of blocking oxide 308, the layer of silicon 310, and the core oxide 314 can be deposited using any suitable deposition processes and/or apparatus. For example, the CVD apparatus 130a and the PVD apparatus 130b of FIG. 1 can be used to perform CVD and PVD, respectively, to deposit the layer of blocking oxide 308, the layer of silicon 310, and the core oxide 314. Alternatively or additionally the ALD apparatus 130c, which can be a stand-alone apparatus or a cluster tool, that can be used to perform an ALD process to deposit the layer of blocking oxide 308, the layer of silicon 310, and the core oxide 314. One such apparatus can be, for example, the OLYMPIA® line of ALD apparatus, available from Applied Materials, Inc.

After the core oxide 314 is deposited to fill the silicon channel 312 at 210, at 211 a layer of insulating material 315 can optionally be deposited to cover a last layer of the stack of the memory cell layers 302 and layers 304 and the filled memory hole 306, as shown in FIG. 3C. The layer of insulating material 315 can be any suitable material including, but not limited to, silicon oxide, silicon nitride, etc., and depending on the material used for the layer of insulating material 315, the layer of insulating material 315 can be deposited using one of the apparatuses 130a-130c. The insulating material 315 is used to protect the memory cell layers 302.

Figure 3D:
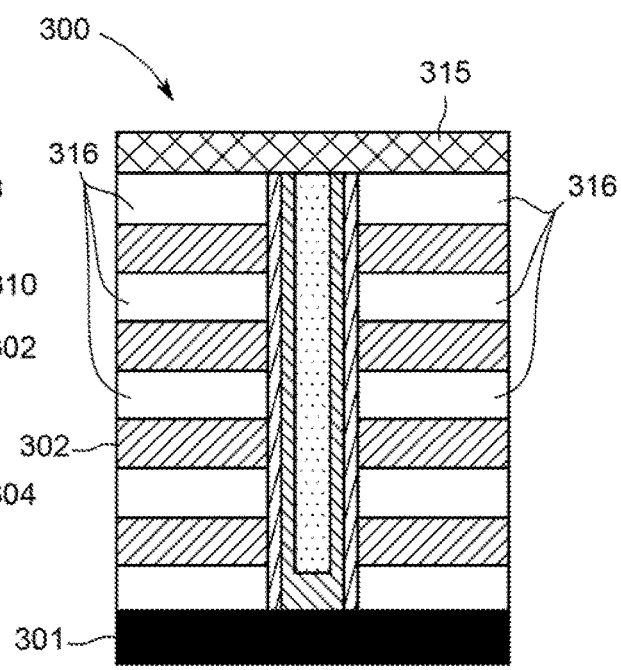

After the core oxide 314 is deposited to fill the silicon channel 312 at 210 and, when performed, after the deposition process of 211 is performed, at 212 the layers 304 (e.g., layers of carbon) are removed by selectively oxidizing the layers 304 of carbon to form air gaps or spaces 316 between alternating layers of the memory cell layers 302 (e.g., layers of ruthenium), as depicted in FIG. 3D. Removal of the layers 304 of carbon may be achieved using any suitable etching or patterning processes to selectively remove the layers 304 of carbon from the memory device 300 without undesirably damaging the memory cell layers 302 of ruthenium.

For example, any isotropic etch process that is selective to at least the memory cell layers 302 of ruthenium may be employed to remove the layers 304 of carbon with high selectivity. For example, in some embodiments, the layers 304 of carbon can be removed with a reactive species that is formed via a remote plasma from a process gas comprising oxygen ($O_2$) and nitrogen trifluoride ($NF_3$), such as an etching apparatus 120 of FIG. 1. The isotropic etch process can be performed in any suitable isotropic etch apparatus. Highly selective, isotropic dry etching processes that may be used for the removal of the layers 304 are described in U.S. Pat. No. 9,165,786, entitled "Integrated oxide and nitride recess for better channel contact in 3D architectures" and filed Aug. 5, 2014. The dry etch process may be performed using a suitable dry etching apparatus such as, for example, the PRODUCER® SELECTRA® line of etching apparatus (FIG. 1), available from Applied Materials, Inc., of Santa Clara, Calif.

Alternatively, or additionally, to remove the layers 304 a selective oxidation apparatus 140 can be used to deposit an oxide layer (not shown) on the layers 304 using rapid thermal oxidation (RTO), radical oxidation, or remote plasma oxidation (RPO), for example, decoupled plasma oxidation (DPO). In some embodiments, where a low thermal budget and/or reduced diffusion of oxygen are desired, plasma oxidation or radical oxidation may be utilized. As used herein, a low thermal budget means a thermal budget less than a furnace process of tens of minutes at 850 degrees Celsius peak temperature. For example, when RPO is used at 212, one or more suitable plasma reactors, such as RPO reactors available from Applied Materials, Inc. can be used to provide the oxide layer on the layers 304.

Alternatively, a high thermal budget processes (i.e., high oxygen diffusion) may also be utilized. For example, high thermal budget processes (e.g., wet, dry, or RTO) can provide conformal oxidation, faster oxidation rates, and thicker oxidation.

The type of selective oxidation apparatus 140 and/or etching apparatus 120 used to remove the layers 304 of carbon can depend on one or more factors including, but not limited to, time constraints, desired oxidation rates, etc.

Regardless of the selective oxidation apparatus 140 and/or etching apparatus 120 used, after removal of the layers 304 of carbon from the memory device 300, a suspended film stack with only the memory cell layers 302 of ruthenium remains on the substrate 301 for further processing.

Figure 3E:
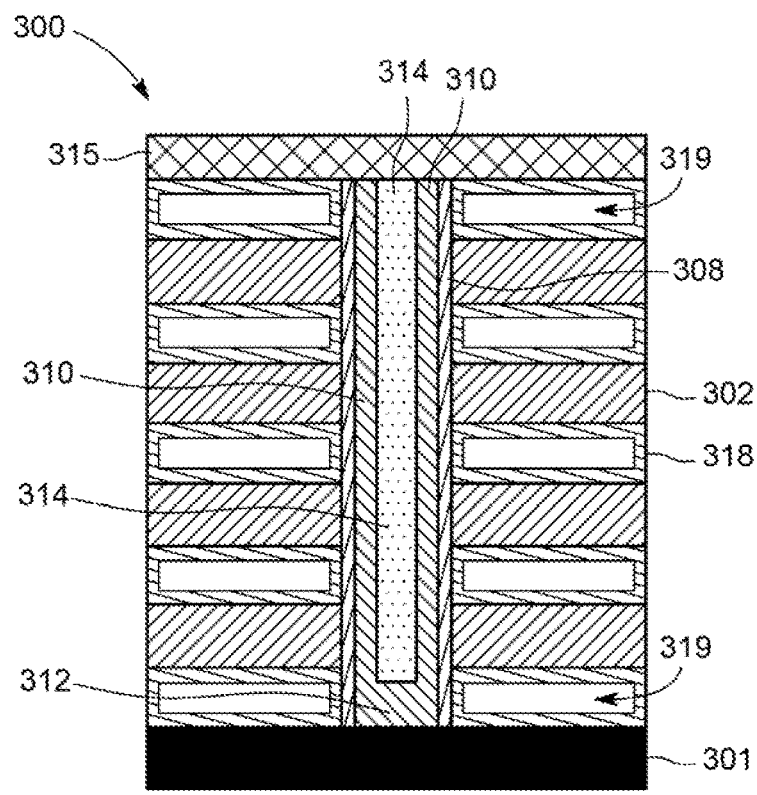

More particularly, with reference to FIG. 3E, at 214 in some embodiments a third layer of material 318 (e.g., oxide, silicon oxide, etc.) can be deposited to partially fill the spaces 316 to leave air gaps 319 therein. The third layer of material 318 can be deposited using, for example, the CVD apparatus 130a or the ALD apparatus 130c of FIG. 1. The spaces 316 can be partially filled such that the air gaps 319 can take up any specific volume of the spaces 316.

Figure 3F:
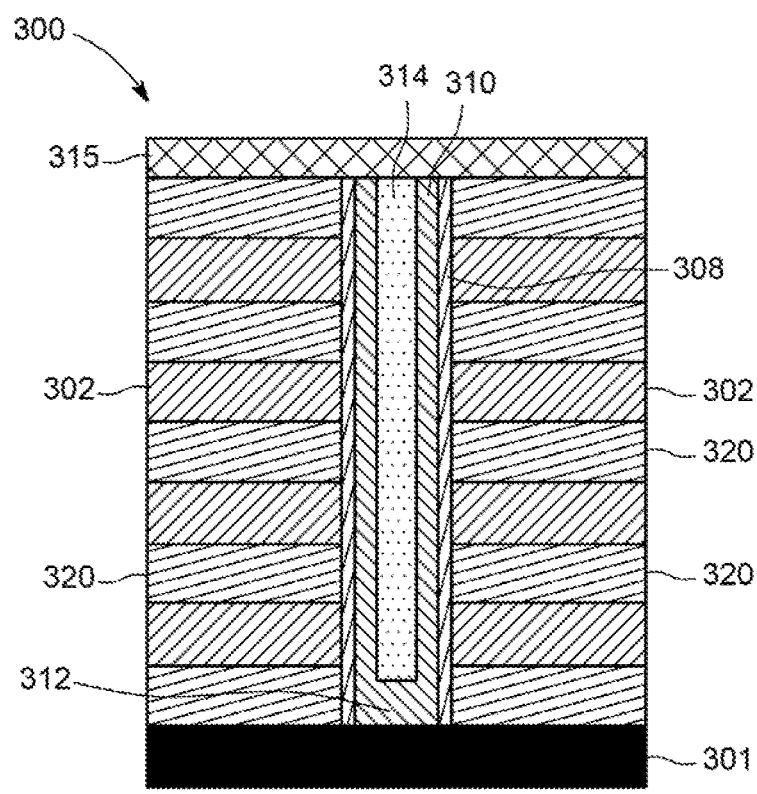

Conversely, in some embodiments, at 214, with reference to FIG. 3F, a fourth layer of material 320 (e.g., low k (dielectric constant) oxide material) can be deposited to fill the spaces 316 (i.e., with no air gaps 319). The fourth layer of material 320 can be deposited using, for example, the CVD apparatus 130a or the ALD apparatus 130c of FIG. 1. The low k oxide material can include, but is not limited to, silicon oxide, silicon dioxide, etc. The fourth layer of material 320 can have a dielectric constant ranging from about 3.5 to about 4.1.

After one of the processes of 214 are completed, the memory device 300 will have the stack of alternating memory cell layers 302 and one of the third layer of material 318 (e.g., oxide) with the air gap 319 contained therein or the fourth layer of material 320 (e.g., low k oxide material). Once formed, the 3D NAND memory device 30 can be further processed to deposit a gate oxide, e.g., for gate formation.

The methods described herein can be used to form the 3D NAND memory device, and cross-talk, e.g., leakage of trapped charges, among neighboring memory cells of the memory cell layers 302 of the memory device 300 is reduced, if not eliminated, by forming the plurality of memory cells layers 302 with the layers 304 of carbon, which can be removed and replaced with either of the third layer of material 318 (e.g., oxide) with the air gap 319 contained therein or the fourth layer of material 320 (e.g., low k oxide material). Moreover, since both the memory cell layers 302 and layers 304 can be etched out using oxygen based etch processes, high aspect ratio memory hole etch and gap fill can be less challenging when compared to conventional processes. Furthermore, when the memory cell layers 302 are formed from ruthenium, which has tensile stress, and the layers 304 are formed from carbon, which has compressive stress, the alternating memory cell layers 302 and layers 304 will have a near neutral stress, which, in turn, can reduce, if not eliminate, the likelihood of pattern collapse, and can allow for the overall stack height of the memory device 300 to be relatively thin when compared to conventional memory devices. Additionally, the use of conventional replacement metal gate processes, which are sometimes used to build word line staircase, are eliminated, as the memory cell layers 302 are made from one or more of the above described metals (e.g., ruthenium).

While the foregoing is directed to embodiments of the present disclosure, other and further embodiments of the disclosure may be devised without departing from the basic scope thereof.

The invention claimed is:

1. A method for forming a plurality of nonvolatile memory cells, comprising:
  forming, on a substrate, a stack of alternating layers including a first layer of material and a second layer of material different from the first layer of material, wherein the first layer of material is ruthenium;
  forming a memory hole in the stack of alternating layers of he first layer of material and the second layer of material;
  depositing a layer of blocking oxide on sides defining the memory hole;
  depositing a layer of silicon directly atop the layer of blocking oxide to form a silicon channel that does not extend into the substrate;
  depositing core oxide to fill the silicon channel;
  removing the second layer of material to form spaces between the alternating layers of the first layer of material; and
  one of depositing a third layer of material to partially fill the spaces to leave air gaps therein or depositing, a fourth layer of material to fill the spaces.

2. The method of claim 1, wherein the second layer is carbon, silicon, silicon carbide, or silicon oxycarbide, the third layer of material if used is oxide, and the fourth layer of material if used is a low k oxide.

3. The method of claim 2, wherein the low k oxide is one of n oxide or silicon dioxide having a dielectric constant from about 3.5 to about 4.1.

4. The method of claim 1, wherein the one of depositing the third layer of material to partially fill the spaces to leave air gaps therein or depositing the fourth layer of material in the spaces is performed using one of chemical vapor deposition or atomic layer deposition.

5. The method of claim 1, wherein the first layer of material is deposited using physical vapor deposition and the second layer of material is deposited using chemical vapor deposition.

6. The method of claim 1, wherein depositing the layer of blocking oxide, depositing the layer of silicon, and depositing the core oxide is performed using one of chemical vapor deposition or atomic layer deposition.

7. The method of claim 1, wherein removing the second layer of material is performed using one of an isotropic etch process that uses an oxygen containing gas, rapid thermal oxidation, radical oxidation, or remote plasma oxidation.

8. The method of claim 1, wherein forming the memory hole is performed using a dry etching process that uses an oxygen containing gas comprising $CO$, $CO_2$, $H_2O$, $NO$, $N_2O$, $NO_2$, $O_2$, or $O_3$.

9. The method of claim 1, further comprising, after depositing the core oxide to fill the silicon channel, depositing a layer of insulating material to cover a last layer of the stack of alternating layers and the memory hole.

10. The method of claim 1, wherein the blocking oxide comprises at least one of poly Si, $SiO_2$, SiOC, $Si_3N_4$, $Al_2O_3$, $Y_2O_3$, $ZrO_2$, or $HfO_2$, and the core oxide is made of one of SiO or SiOC.

11. A method for forming a plurality of nonvolatile memory cells, comprising:
  forming, on a substrate, a stack of alternating layers including a first layer of material, wherein the first layer of material is a conductive layer, and a second layer of material that is carbon, silicon, silicon carbide, or silicon oxycarbide;
  forming a memory hole in the stack of alternating layers of the first ayer of material and the second layer of material;
  depositing a layer of blocking oxide on sides defining the memory hole;
  depositing a layer of silicon directly atop the layer of blocking oxide to form a silicon channel that does not extend into the substrate:
  depositing core oxide to fill the silicon channel;
  removing the second layer of material to form spaces between the alternating layers of the first layer of material; and
  one of depositing a third layer of material to partially fill the spaces to leave gaps therein or depositing a fourth layer of material to fill the spaces,
  wherein the first layer of material is ruthenium, the third layer of material if used is oxide, and the fourth layer of material if used is a low k oxide.

12. A system for forming a plurality of nonvolatile memory cells, comprising:
  an apparatus configured to form, on a substrate, a stack of alternating layers including a first layer of material different from the first layer of material, wherein the first layer of material is ruthenium;
  an apparatus configured to form a memory hole in the stack of alternating layers of the first layer of material and the second layer of material;
  an apparatus configured to deposit a layer of blocking oxide on sides defining the memory hole, deposit a layer of silicon directly atop the layer of blocking oxide to form a silicon channel that does not extend into the substrate, and deposit a core oxide to fill the silicon channel;
  an apparatus configured to remove the second layer of material to form pac between the alternating layers of the first layer of material; and
  an apparatus configured to one of deposit a third layer of material to partially fill the spaces to leave air gaps therein or deposit a fourth layer of material to fill the spaces.

13. The system of claim 12, wherein the second layer of material is carbon, silicon, silicon carbide, or silicon oxycarbide the third layer of material if used is oxide, and the fourth layer of material if used is low k oxide.

14. The system of claim 13, wherein the low k oxide is one of silicon oxide or silicon dioxide having a dielectric constant from about 3.5 to about 4.1.

15. The system of claim 12, wherein the apparatus configured to one of deposit the third layer of material to partially fill the spaces to leave air gaps therein or deposit the fourth layer of material in the spaces is one of a chemical vapor deposition apparatus or an atomic layer deposition apparatus.

16. The system of claim 12, wherein the apparatus configured to deposit the first layer of material is a physical vapor deposition apparatus and the apparatus configured to deposit the second layer of material is a chemical vapor deposition apparatus.

17. The system of claim 12, wherein the apparatus configured to deposit the layer of blocking oxide, deposit the layer of silicon, and deposit the core oxide is one of a chemical vapor deposition apparatus or an atomic layer deposition apparatus.

18. The system of claim 12, wherein the apparatus configured to remove the second layer of material is one of an isotropic etch apparatus that uses an oxygen containing gas or a selective oxidation apparatus that uses rapid thermal oxidation, radical oxidation, or remote plasma oxidation.

19. The system of claim 12, wherein the apparatus configured to forb the memory hole is a dry etching apparatus that uses an oxygen containing gas.

20. The system of claim 12, further comprising an apparatus configured to, after depositing the core oxide to fill the silicon channel, deposit a layer of insulating material to cover a last layer of the stack of alternating layers and the memory hole.

* * * * *

UNITED STATES PATENT AND TRADEMARK OFFICE
CERTIFICATE OF CORRECTION

PATENT NO. : 10,964,717 B2
APPLICATION NO. : 16/528800
DATED : March 30, 2021
INVENTOR(S) : Kang et al.

It is certified that error appears in the above-identified patent and that said Letters Patent is hereby corrected as shown below:

In the Claims

Column 7, Line 14 in Claim 1, delete "he" and insert --the--.

Column 7, Line 26 in Claim 1, delete "depositing," and insert --depositing--.

Column 7, Line 33 in Claim 3, delete "n oxide" and insert --silicon oxide--.

Column 8, Line 5 in Claim 11, delete "ayer" and insert --layer--.

Column 8, Line 11 in Claim 11, delete "substrate:" and insert --substrate;--.

Column 8, Line 17 in Claim 11, delete "leave" and insert --leave air--.

Column 8, Line 39 in Claim 12, delete "pac" and insert --spaces--.

Column 9, Line 7 in Claim 19, delete "forb" and insert --form--.

Signed and Sealed this
Seventeenth Day of September, 2024

Katherine Kelly Vidal
*Director of the United States Patent and Trademark Office*